United States Patent
Besshi et al.

(10) Patent No.: US 10,553,559 B2
(45) Date of Patent: Feb. 4, 2020

(54) POWER SEMICONDUCTOR DEVICE

(71) Applicant: MITSUBISHI ELECTRIC CORPORATION, Chiyoda-ku, Tokyo (JP)

(72) Inventors: Noriyuki Besshi, Tokyo (JP); Ryuichi Ishii, Tokyo (JP); Masaru Fuku, Tokyo (JP); Takayuki Yamada, Tokyo (JP); Takao Mitsui, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/741,841

(22) PCT Filed: Sep. 29, 2016

(86) PCT No.: PCT/JP2016/078832
§ 371 (c)(1),
(2) Date: Jan. 4, 2018

(87) PCT Pub. No.: WO2017/073233
PCT Pub. Date: May 4, 2017

(65) Prior Publication Data
US 2018/0197838 A1    Jul. 12, 2018

(30) Foreign Application Priority Data

Oct. 28, 2015   (JP) .................................. 2015-211583

(51) Int. Cl.
*H01L 25/065* (2006.01)
*H01L 25/07* (2006.01)
(Continued)

(52) U.S. Cl.
CPC ........ *H01L 25/0655* (2013.01); *H01L 23/053* (2013.01); *H01L 23/3735* (2013.01);
(Continued)

(58) Field of Classification Search
CPC ..... H01L 23/043–051; H01L 23/49822; H01L 23/5383
See application file for complete search history.

(56) References Cited

U.S. PATENT DOCUMENTS

2014/0191399 A1* 7/2014 Ando .................... H01L 24/36
257/746
2015/0255444 A1* 9/2015 Sato .................. H01L 21/67121
257/677

FOREIGN PATENT DOCUMENTS

JP    11-204703 A    7/1999
JP    2008-41743 A   2/2008
(Continued)

OTHER PUBLICATIONS

JP 2009-021286 machine translation (Year: 2009).*
(Continued)

*Primary Examiner* — Vincent Wall
(74) *Attorney, Agent, or Firm* — Buchanan Ingersoll & Rooney PC

(57) ABSTRACT

Provided is a power semiconductor device which is able to have improved connection reliability between a wiring line and an electrode of a power semiconductor element in comparison to conventional power semiconductor devices. This power semiconductor device is provided with: a semiconductor element; an insulating substrate having an electrode layer to which the semiconductor element is bonded; an external wiring line which is solder bonded to an upper surface electrode of the semiconductor element and has an end portion for external connection, said end portion being bent toward the upper surface; and a frame member which is affixed to the electrode layer of the insulating substrate. The frame member has a fitting portion that is fitted with the end portion for external connection; and the external wiring
(Continued)

line has at least two projected portions that protrude toward the semiconductor element.

5 Claims, 7 Drawing Sheets

(51) Int. Cl.
    *H01L 25/18*    (2006.01)
    *H01L 23/373*   (2006.01)
    *H01L 23/492*   (2006.01)
    *H01L 23/00*    (2006.01)
    *H01L 23/053*   (2006.01)
    *H01L 23/498*   (2006.01)

(52) U.S. Cl.
    CPC .......... *H01L 23/4922* (2013.01); *H01L 24/29* (2013.01); *H01L 24/32* (2013.01); *H01L 24/33* (2013.01); *H01L 24/48* (2013.01); *H01L 24/73* (2013.01); *H01L 25/07* (2013.01); *H01L 25/18* (2013.01); *H01L 23/49811* (2013.01); *H01L 2224/29111* (2013.01); *H01L 2224/29144* (2013.01); *H01L 2224/29147* (2013.01); *H01L 2224/32059* (2013.01); *H01L 2224/32137* (2013.01); *H01L 2224/32258* (2013.01); *H01L 2224/3303* (2013.01); *H01L 2224/33181* (2013.01); *H01L 2224/40137* (2013.01); *H01L 2224/48106* (2013.01); *H01L 2224/48175* (2013.01); *H01L 2224/73215* (2013.01); *H01L 2224/73265* (2013.01); *H01L 2924/014* (2013.01); *H01L 2924/0132* (2013.01); *H01L 2924/13055* (2013.01)

(56) References Cited

FOREIGN PATENT DOCUMENTS

| | | |
|---|---|---|
| JP | 2008-294338 A | 12/2008 |
| JP | 2009-21286 A | 1/2009 |
| JP | 2010-177573 A | 8/2010 |
| JP | 2013-85470 A | 5/2013 |
| JP | 2013-171870 A | 9/2013 |
| JP | 2015-170731 A | 9/2015 |
| JP | 2015-204319 A | 11/2015 |
| JP | 2016-51878 A | 4/2016 |
| WO | WO 2015/107871 A | 7/2015 |

OTHER PUBLICATIONS

Machine translation of the written opinion of the ISA (Year: 2016).*
International Search Report (PCT/ISA/210) dated Nov. 22, 2016, by the Japanese Patent Office as the International Searching Authority for International Application No. PCT/JP 2016/078832.

* cited by examiner

POWER SEMICONDUCTOR DEVICE

TECHNICAL FIELD

The present invention relates to a power semiconductor device.

BACKGROUND ART

In recent years, power semiconductor devices have been applied to general industries and electric railroads, as well as have been mounted on vehicles, in view of environment issues. In particular, the power semiconductor devices mounted on vehicles are required to have high reliability in a limited space, and to achieve, at a low cost, an added value of improved fuel efficiency by mounting a motor and an inverter as compared with a conventional engine drive system. Specifically, a water-cooling power semiconductor device, which is typically mounted in an engine compartment, is required to achieve heat resistance and vibration resistance in the engine compartment as well as reduction in size. One of internal components of a power semiconductor device that account for a major proportion of cost is a semiconductor element. Accordingly, cost reduction is achieved, in the production of semiconductor elements, through reduction in loss of semiconductor elements, or reduction in size of the semiconductor elements to increase the number of semiconductor elements obtained from a wafer through enhancement of an operable temperature range by improving heat dissipation structure.

A power semiconductor device includes a semiconductor element mainly made of Si (linear expansion coefficient: 2.5 ppm/K) and external wiring mainly made of Cu (linear expansion coefficient: 16.8 ppm/K), Al (linear expansion coefficient: 23.0 ppm/K), and the like. The power semiconductor element has a product life determined by reliability of connection between electrodes on upper and lower surfaces of the semiconductor element and the external wiring.

The semiconductor element includes the lower surface electrode connected by soldering or the like, and reliability improvement through material improvement is reaching a limit. Recently considered is application of joining or the like by a CuSn compound, by Ag sintering, by Cu sintering, and the like, which achieve higher strength than solder.

On the other hand, the upper surface electrode of the semiconductor element is conventionally connected by Al wire bond joining to achieve required current capacity and connection reliability. However, the reduction in size of semiconductor elements causes increase in current density per unit volume of a connected portion, which may undesirably lead to deterioration in connection reliability.

PRIOR ART DOCUMENT

Patent Document

Patent Document 1: JP 2013-171870 A

SUMMARY OF THE INVENTION

Problems to be Solved by the Invention

The above problems of the conventional semiconductor device will be described in further detail.

As disclosed in Patent Document 1, for example, a power semiconductor device (power semiconductor module) includes a plurality of sets, each which contains a plurality of insulated gate bipolar transistors (IGBTs) used as power conversion switching devices and a free wheel diode (FWD) of inverse-parallel connection. The plurality of sets is disposed and wired on an insulation circuit board to achieve a semiconductor element configuration of an inverter circuit or the like.

The insulation circuit board anchored onto a metal substrate is provided thereon with the lower surface electrodes of the IGBTs and lower ends of a plurality of external terminals, which are soldered. The upper electrodes of the IGBTs are provided with Al wiring by wire bonding, and the Al wiring is electrically connected to the external terminals.

The metal substrate has an outer periphery provided with a resin case having a frame shape. The resin case is anchored to the outer periphery and surrounds the entire insulation circuit board. The resin case and the metal substrate define an internal space of the resin case, which is filled with an insulating resin sealing material to form a power semiconductor device.

In the conventional power semiconductor device thus configured, provision of the Al wiring by wire bonding to the upper surface electrodes of the IGBTs causes the following problems. Specifically, a wiring space is required for wire bonding the Al wiring on the metal substrate, and current density is increased by reduction in size of the semiconductor element as described above, resulting in lower connection reliability.

The present invention has been made to solve the problems mentioned above, and an object thereof is to provide a power semiconductor device that can achieves improvement, from a conventional configuration, in reliability of connection between an electrode and wiring of a power semiconductor element.

Means for Solving the Problems

In order to achieve the object mentioned above, the present invention provides the following configuration.

Specifically, a power semiconductor device comprising:

an insulating substrate configured to include a first conductor layer and a second conductor layer provided respectively on opposite surfaces in a thickness direction of an insulating layer;

a plurality of semiconductor elements configured to be joined to the first conductor layer via a first anchoring layer;

an external connecting member configured to be commonly used with the semiconductor elements, and have an element coupler and an external connection end, the element coupler configured to extend along the first conductor layer with the semiconductor elements positioned between the external connecting member and the first conductor layer, and be joined to the semiconductor elements via a second anchoring layer, the external connection end configured to bend an end of the element coupler in the thickness direction; and a frame member configured to surround the plurality of semiconductor elements on the first conductor layer and be joined to the first conductor layer via a third anchoring layer; wherein the frame member includes a fitting portion fitted to the external connection end, and the external connecting member includes at least two projections extending toward the semiconductor elements.

Effects of the Invention

The power semiconductor device according to one aspect of the present invention includes the frame member provided with the fitting portion and the external connecting member provided with the projection. The external connection end of the external connecting member extends in the thickness direction and is extracted from the upper surface of the power semiconductor device, thereby achieving reduction in size of the power semiconductor device. Furthermore, the frame member has the fitting portion fitted to the external connection end, and the external connecting member has the at least two projections, so that precise positioning of the external connecting member can be achieved without using any jig tool. This configuration enables precise determination of the minimum thickness and the maximum thickness of the second anchoring layer, therefore, more stabilized joint reliability of the external connecting member as compared with a conventional configuration can be achieved.

EMBODIMENTS OF THE INVENTION

Power semiconductor devices according to embodiments will now be described below with reference to the drawings. These drawings depict identical or similar constituent elements denoted by same reference symbols. In order to avoid unnecessary redundancy and facilitate understanding by those skilled in the art, the following description may not include details on already well-known matters and repeated reference to substantially identical configurations. Furthermore, the following description and the accompanying drawings are not be provided to limit the subject matter recited in the claims.

Embodiment 1

Figure 1:
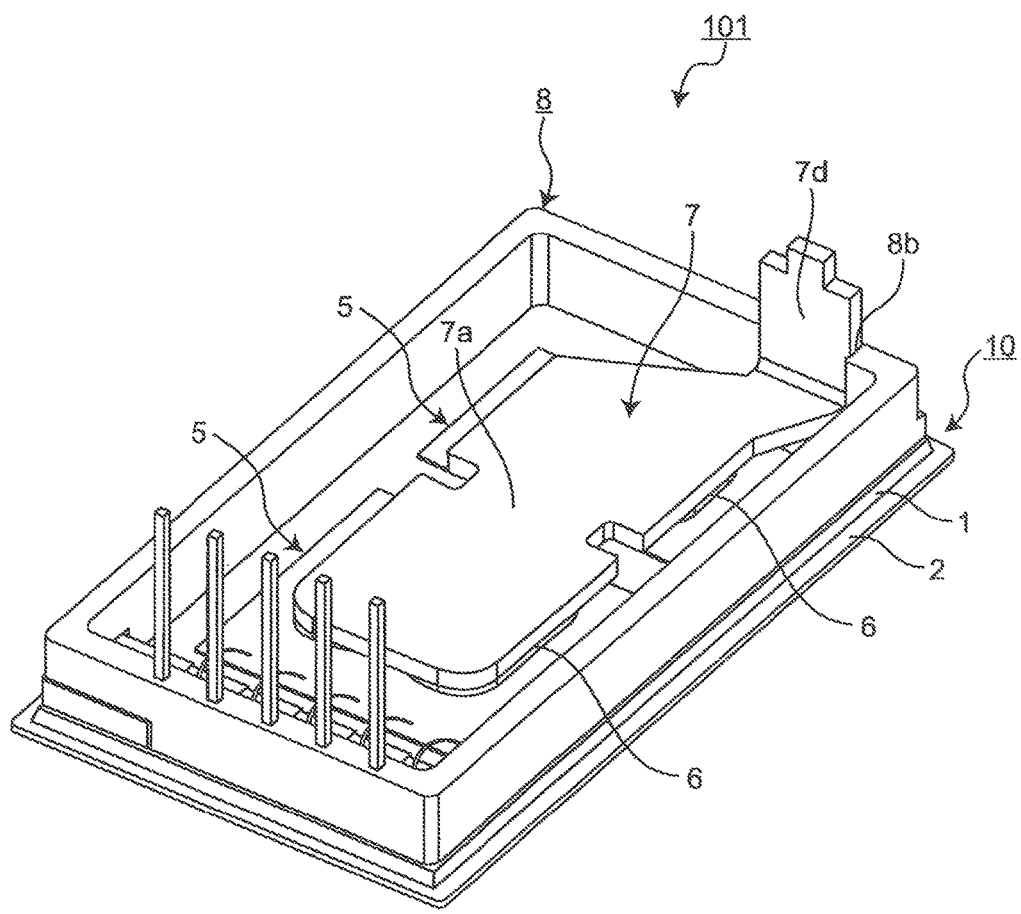
FIG. 1 is a perspective view of a power semiconductor device according to an embodiment 1.
Figure 2:
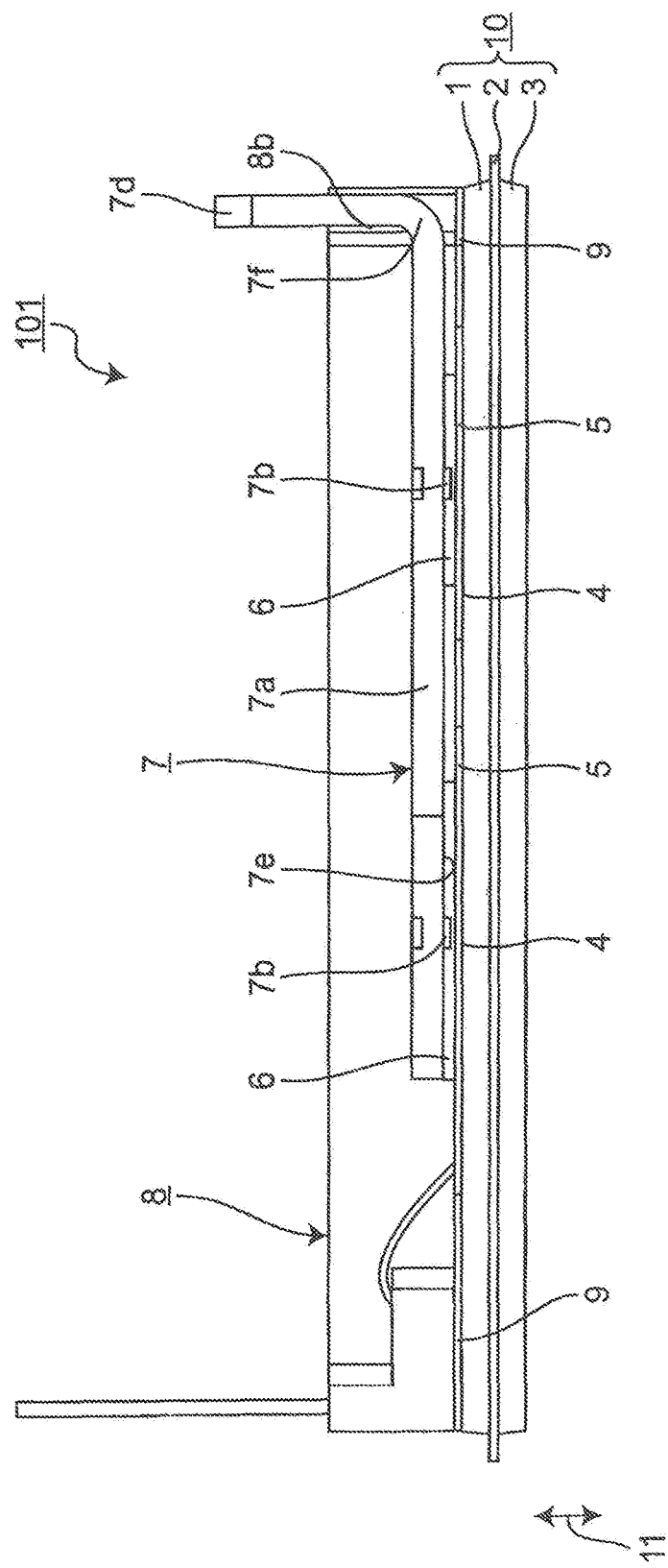
FIG. 2 is a sectional view of the power semiconductor device depicted in FIG. 1.

FIG. 1 is a perspective view of a power semiconductor device 101 according to the present embodiment, and FIG. 2 is a sectional view thereof. The power semiconductor device 101 includes basic constituent elements, namely, a plurality of semiconductor elements 5, an external connecting member 7, a frame member 8, and an insulating substrate 10. These constituent elements will be sequentially described below.

As depicted in FIGS. 1 and 2, the insulating substrate 10 includes a first conductor layer 1, an insulating layer 2, and a second conductor layer 3. The first conductor layer 1 and the second conductor layer 3 are provided respectively on opposite surfaces in a thickness direction 11 of the insulating layer 2. The insulating layer 2 is preferably made of a ceramic material such as AlN, $Si_3N_4$, or $Al_2O_3$, having an insulation property and high thermal conductivity. Examples of the insulating layer 2 also include an epoxy resin insulating layer containing a BN filler or the like. The insulating layer 2 is about 0.3 mm to 1 mm in thickness. Each of the first conductor layer 1 and the second conductor layer 3 can be made of Cu, Al, or the like, or can include stacked layers made of Cu and Al. Each of the first conductor layer 1 and the second conductor layer 3 is about 0.2 mm to 1 mm in thickness. Since the power semiconductor elements 5 are joined to the first conductor layer 1, the first conductor layer 1 having a larger thickness achieves higher heat dissipation from the power semiconductor elements 5. Meanwhile, the first conductor layer 1 and the second conductor layer 3 having a larger thickness cause higher thermal stress to the insulating layer 2. Therefore, the first conductor layer 1 and the second conductor layer 3 having a large thickness require a large margin for prevention of damage to the insulating layer 2. The first conductor layer 1 and the second conductor layer 3 are thus practically made to be about 0.3 mm to 0.6 mm thick.

The plurality of semiconductor elements 5 is joined onto the first conductor layer 1. The power semiconductor elements 5 according to the present embodiment include both an IGBT and a diode, as to be described later. The power semiconductor elements 5 are typically made of Si, and can alternatively be made of a material such as GaN or SiC, which enables operation at high temperature. Adoption of such a material enabling operation at high temperature preferably leads to reduction in size of the entire power semiconductor device 101.

Each of the semiconductor elements 5 includes an electrode provided on each of the two opposite surfaces in a thickness direction thereof, and the electrode on a first one of the surfaces, e.g. a lower surface, is joined to the first conductor layer 1 by a first anchoring layer 4. The first anchoring layer 4 is made of a metal substance having conductivity and being mechanically anchorable, such as solder, an Ag conductor or a Cu conductor. When the first anchoring layer 4 is made of a material having a high melting point, like an Ag layer, higher reliability in the first anchoring layer 4 can be obtained in a case where operation temperature of the power semiconductor elements 5 rises.

The external connecting member 7 includes basic constituent elements, namely, an element coupler 7a and an external connection end 7d, which are formed integrally with each other. The element coupler 7a are commonly used by the semiconductor elements 5, extends along the first conductor layer 1 with the semiconductor elements 5 positioned between the external connecting member 7 and the first conductor layer 1, and is joined to each of the electrodes on a second one of the surfaces, e.g. an upper surface, of corresponding one of the semiconductor elements 5 by using a second anchoring layer 6. The external connection end 7d is bent in the thickness direction 11 from the element coupler 7a, and achieves electrical connection to an external device.

The external connecting member 7 thus configured serves to diffuse heat generated at the power semiconductor elements 5 to a portion connected with the external device or to a peripheral sealing material (not depicted). Therefore, the external connecting member 7 also needs to have high thermal conductivity, and is effectively made of Cu or the like.

The external connecting member 7 is about 0.2 mm to 1 mm in thickness, for example. The external connecting member 7 having a larger thickness has higher thermal stress to the power semiconductor elements 5 and is thus limited in thickness. Meanwhile, the external connecting member 7 having an excessively small thickness generates large heat due to ohmic resistance during energization. The external connecting member 7 thus needs to have an appropriate thickness.

Further, the external connecting member 7 is provided, at the element coupler 7a, with at least two projections 7b extending toward the semiconductor elements 5. This feature will be described later.

The second anchoring layer 6 is preferably made of a material such as solder, Ag, or Cu, or an electrically conductive material like a CuSn alloy. As the second anchoring layer 6 is positioned to be in direct contact with the power semiconductor elements 5, it preferably has a high melting point. More specifically, when metal is in use at a temperature not less than recrystallization temperature, its crystal grain boundary diffuses to migrate and then the crystal grains are coarsened. As a result the metal has the property to be less resistant to metal fatigue. A material having a low melting point such as solder is industrially easy to handle as it is joined at low heating temperature. However, considered materials in terms of long-term reliability include an Ag sintered material, a Cu sintered material, and a CuSn sintered material, which have a melting point being low at the beginning of joining but increasing during the joining.

The frame member 8 surrounds all the semiconductor elements 5 to define an outline of the insulating substrate 10. The frame member 8 in this case has a frame shape, is provided on the entire peripheral edge of the first conductor layer 1, and is joined to the first conductor layer 1 via a third anchoring layer 9. As depicted, each of the electrodes of the power semiconductor device 101 has a distal end projecting from the outer surface of the frame member 8 so as to be able to electrically connect with the external device.

The frame member 8 is made of a resin material that can be projection molded and has high heat resistance. Preferred examples of the material include polyphenylene sulfide (PPS), a liquid crystal resin, and a fluorine-based resin. A sealing material is injected into an inside of the frame member 8, where the semiconductor elements 5, the external connecting member 7, and the like are arranged, and seals the inside. This sealing secures insulation between a collector and an emitter of each of the semiconductor elements 5, and insulation between the collector and a heat sink around a surface of the insulating substrate 10.

The power semiconductor device 101 according to the present embodiment thus configured relates to an inverter configured to drive a motor or the like. In a case where the inverter is configured to drive the motor, the power semiconductor device 101 ordinarily allows current of several hundred amperes to flow therethrough. The external connecting member 7 thus need to be kept within allowable member temperature and allowable ambient temperature in accordance with the flowing current.

As in a conventional power semiconductor device, temperature change of the semiconductor elements or the like due to increase or decrease in load of the motor may cause thermal stress at a joint inside the power semiconductor device, and repeated temperature change may cause deterioration of the joint. So, the power semiconductor device has a life limit in spite of demands for long-time use. The life of the power semiconductor device thus needs to be designed for a guarantee of a safe use period.

Also in the power semiconductor device 101 according to the present embodiment, the external connecting member 7 is expanded or contracted due to temperature increase during energization. Especially, the external connecting member 7 is anchored to the upper surface electrodes of the power semiconductor elements 5. Thus, Large deformation of the external connecting member 7 will lead to application of stress to the power semiconductor elements 5, so that defects such as deformation of the upper surface electrodes of the power semiconductor elements 5 and the like may be caused.

Furthermore, the second anchoring layer 6 will have a crack and its growth upon receipt of thermal stress. Decrease in sectional area of a joint in the second anchoring layer 6 will cause to increase the self-heating at the joint and to increase in repeated thermal stress. When the joint has progressed crack growth and the semiconductor elements 5 and the external connecting member 7 are disconnected from each other, the upper surface electrodes of the power semiconductor elements 5 and the external connecting member 7 have a large potential difference therebetween and cause arc discharge, resulting in malfunction of the power semiconductor device. The second anchoring layer 6 thus needs to have crack growth at adequately low speed.

It is preferred, in terms of wiring inductance, that the power semiconductor elements 5 include a set of an IGBT and a diode disposed adjacent to each other. The present embodiment adopts this form as described above. Such a configuration has the following problem.

On the other hand, in a case where each of the power semiconductor elements is provided with dedicated connecting member, each member needs to be connected in an upper portion of the module. This configuration causes increase in space for processing or increase in the number of processing steps, which is not preferred in terms of productivity and cost. The plurality of power semiconductor elements simultaneously being joined by the single connecting member can achieve decrease in wiring inductance and simultaneous processing of multiple joints only by single soldering thus, leading to better productivity. In view of this, the present embodiment provides the single external connecting member 7 for the plurality of semiconductor elements 5 as described above.

In a case where the external connecting member has a joint surface to be simultaneously joined to the plurality of semiconductor elements and has an end rising upward in the thickness direction of the insulating substrate for reduction in size of the module, the following problem may arise.

The external connecting member has a center of gravity displaced from a center of gravity of the plurality of power semiconductor elements. The external connecting member then has unstable posture. When the external connecting member is joined by using the second anchoring layer, the second anchoring layer may have a large difference in thickness between a portion for one of the semiconductor elements and a portion for another one of the semiconductor elements. The external connecting member might be inverted in the worst case.

Such a difference in thickness of the second anchoring layer causes the following problems. In a case where the second anchoring layer has a quite large thickness, the second anchoring layer receives small thermal stress but the upper surface electrodes of the power semiconductor elements receive large thermal stress. This accelerates crack growth of the upper surface electrodes. In another case where the second anchoring layer has a quite small thickness, the second anchoring layer receives quite large thermal stress and has very quick crack growth.

As apparent from this, reliability at the joints between the electrodes of the semiconductor elements and the external connecting member is obtained by precisely determining the minimum thickness of and the maximum thickness of the second anchoring layer.

In order to precisely determine the maximum thickness and the minimum thickness of the second anchoring layer 6, the frame member 8 has a fitting portion 8b and the external connecting member 7 has a projection 7b in the present embodiment.

The fitting portion 8b prevents inversion of the external connecting member 7 and regulates displacement of the external connecting member 7 by being fitted to the external connection end 7d of the external connecting member 7. The fitting portion 8b and the external connecting member 7 can be fitted to each other in a state that the fitting portion 8b is entirely or partially in contact with a contact surface of the external connecting member 7. Both the cases achieve similar effects.

The projection 7b of the external connecting member 7 projects toward the semiconductor element 5 from a contact surface 7e in contact with the second anchoring layer 6 on the element coupler 7a, and is provided at one or more positions correspondingly to the second anchoring layer 6 on the power semiconductor element 5. In a case where each of the power semiconductor elements 5 is provided thereon with two second anchoring layers 6, two projections 7b are provided on each of the power semiconductor elements 5. The projections 7b preferably have the same height. The projection 7b and the second anchoring layer 6 are relatively positioned such that the projection 7b is disposed within the second anchoring layer 6 in order to exert a thickness regulation effect. Therefore, variation in finished thickness after anchoring can be suppressed by disposing the projection 7b closer to the center than an end of each of the second anchoring layers 6. If the projection 7b has a portion where stress is concentrated, the portion would be a starting point of the crack when temperature stress is repeatedly applied. Thus, the projection 7b preferably has a cylindrical or elliptic cylindrical shape.

The provision of the projection 7b on the external connecting member 7 and the fitting portion 8b of the frame member 8 enables precise determination of the minimum thickness and the maximum thickness of the second anchoring layer 6 without using any jig tool. This achieves improvement, as compared with a conventional configuration, in reliability of the joint between the electrode of each of the semiconductor elements 5 and the external connecting member 7.

The external connection end 7d of the external connecting member 7 extends in the thickness direction 11 of the insulating substrate 10 and is extracted from the surface (upper surface) of the power semiconductor device 101, for achievement of size reduction of the power semiconductor device 101. Furthermore, the external connecting member 7 is provided correspondingly to the plurality of semiconductor elements 5, for achievement of both productivity and cost effectiveness.

Moreover, the external connecting member 7 preferably has a bent portion 7f (FIG. 2) of a large curvature, between the element coupler 7a and the external connection end 7d, thereby securing large stress relief, i.e. elimination of expansion and contraction or vibration of the external connecting member 7. Such stress relief is alternatively secured by using the external connection end 7d provided with a bent having an S-shape, a bolt type, or the like.

Embodiment 2

Figure 3:
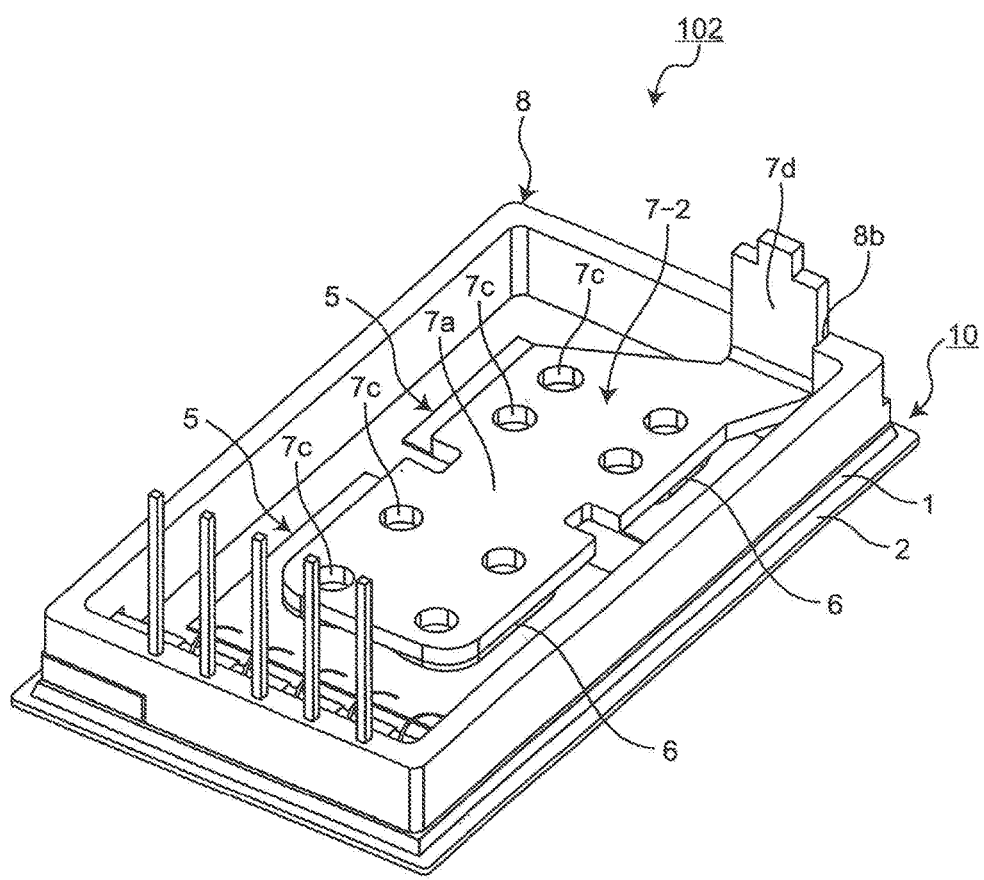
FIG. 3 is a perspective view of a power semiconductor device according to an embodiment 2.
Figure 4:
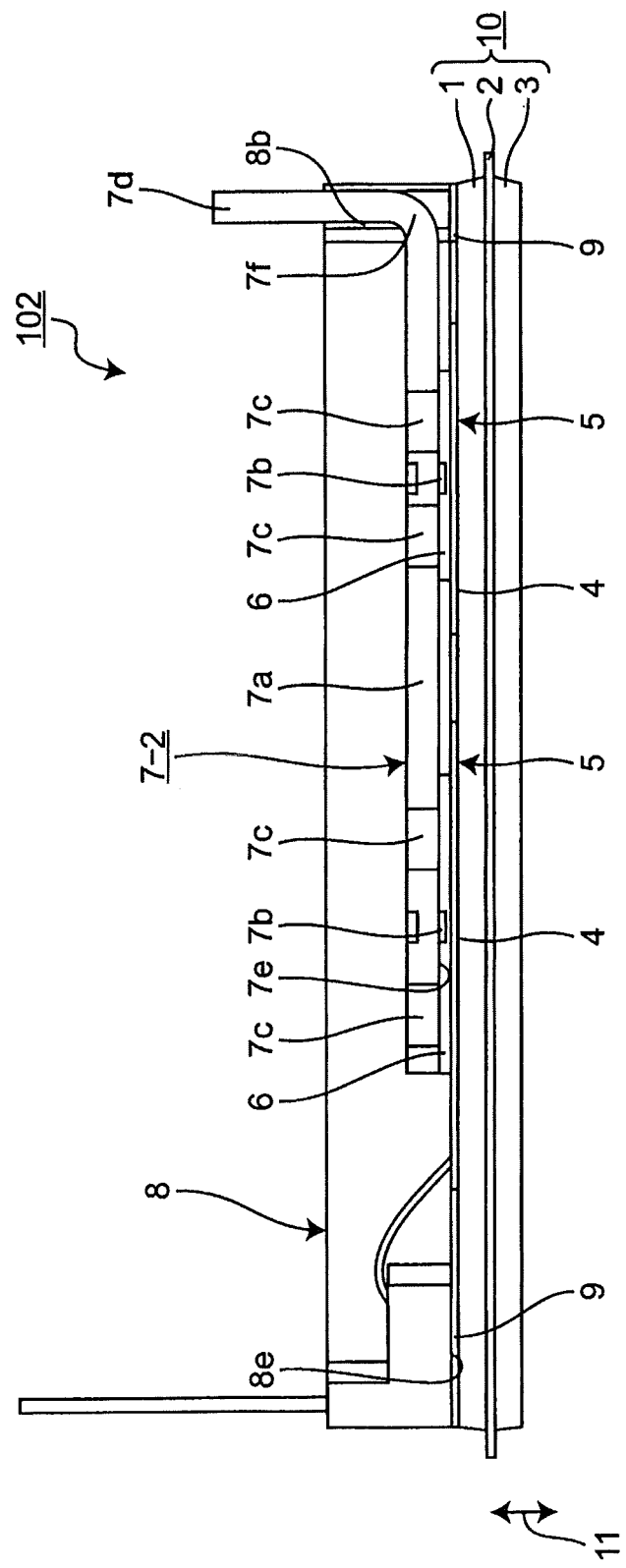
FIG. 4 is a sectional view of the power semiconductor device depicted in FIG. 3.

FIG. 3 depicts a power semiconductor device 102 according to the present embodiment 2 including an external connecting member 7-2 obtained by modifying the external connecting member 7 according to the embodiment 1. The power semiconductor device 102 is configured similarly to the power semiconductor device according to the embodiment 1 except for the external connecting member 7-2, which will mainly be described below. FIG. 4 is a sectional view of the power semiconductor device 102 according to the present embodiment 2.

In a case where the second anchoring layer 6 depicted in FIGS. 3 and 4 is made of solder, the second anchoring layer 6 is provided by printing or dispensing solder paste, or by mounting plate solder. Joining the solder thus provided will cause solder ball dispersion. This problem will be described in detail below.

Solder paste causes solder ball dispersion upon flux volatilization. Plate solder causes solder ball dispersion when being melt at temperature beyond a solder melting point during a dry type reduction process. Such plate solder tends to have more dispersion during a vacuum drawing process for void reduction during solder melting.

The solder ball dispersion can be suppressed by reducing the amount of supplied solder. However, in a case where the supplied solder is short or the semiconductor elements and the external connecting member are not arranged with a fixed positional relation, a region where solder wettability is insufficient is generated and separation due to stress concentration is further developed. Increasing amount of the supplied solder for prevention of such insufficient wetting in an unnecessary manner leads to increase of the solder ball dispersion and generation of a large amount of conductive foreign matter.

A power semiconductor device has secured a spatial insulation distance and a creeping insulation distance corresponding to an operating voltage of several hundred volts to several thousand volts. Dispersion of the conductive foreign matter may require an additional removing step as well as an inspecting step, and cause quality deterioration. It is thus necessary to precisely determine the positional relation between the semiconductor elements and the external connecting member, and supply an appropriate amount of solder.

In view of this, in order to supply the appropriate amount of solder to the second anchoring layer 6, the power semiconductor device 102 according to the present embodiment 2 is configured similarly to the power semiconductor device 101 according to the embodiment 1. In particular, the frame member 8 has the fitting portion 8b, and the external connecting member 7-2 has the projection 7b, and further has a recess 7c.

Figure 7:
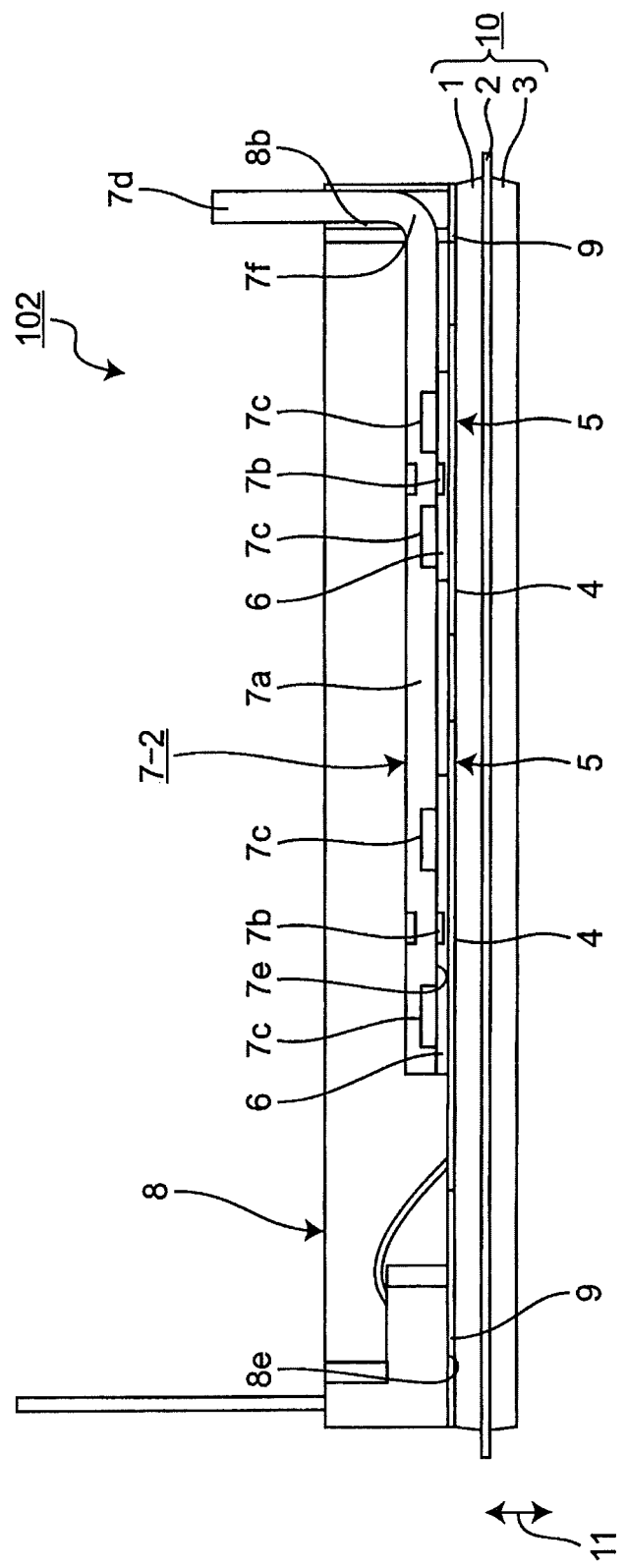
FIG. 7 is a sectional view of a power semiconductor device according to a modification example of the power semiconductor device depicted in FIG. 3.

The recess 7c is provided at the contact surface 7e in contact with the second anchoring layer 6 on the element coupler 7a. The recess 7c can penetrate the external connecting member 7-2 as depicted in FIGS. 3 and 4, or can be provided not to penetrate as depicted in FIG. 7. The recess 7c is not limited to a circular shape as depicted, but can have any appropriate shape. The recess 7c can have a groove shape, for example.

The recess 7c provided at the contact surface 7e serves as a refuge space for the solder supplied for forming the second anchoring layer 6, and receives excessive solder when the supplied solder exceeds the appropriate amount. The recess 7c absorbs or adjusts a variation in an amount of the supplied solder. This configuration can prevent or inhibit generation of conductive foreign matter and solder insufficient wetting, and can precisely determine the thickness of the second anchoring layer 6. As a result, this achieves further improvement, as compared with a conventional configuration, in reliability of the joint between the electrode of each of the semiconductor elements 5 and the external connecting member 7. This configuration obviously inhibits defectiveness caused by the conductive foreign matter.

Embodiment 3

Figure 5:
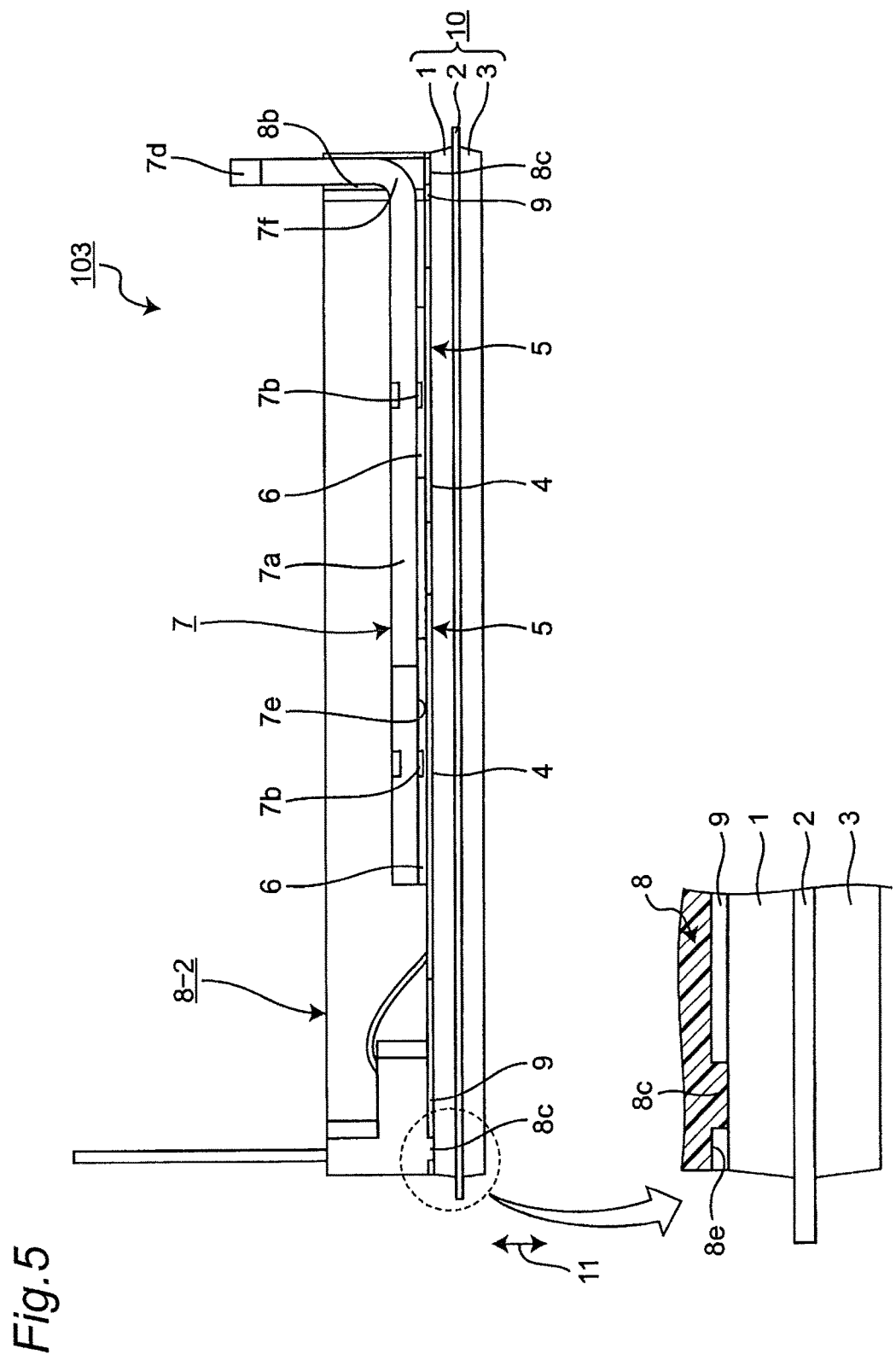
FIG. 5 is a sectional view of a power semiconductor device according to an embodiment 3.

FIG. 5 depicts a power semiconductor device 103 according to the present embodiment 3 including a frame member 8-2 obtained by modifying the frame member 8 according to the embodiment 1 or 2. The power semiconductor device 103 is configured similarly to the power semiconductor device according to the embodiment 1 or 2 except for the frame member 8-2, which will mainly be described below.

The frame member 8-2 according to the present embodiment has a convex 8c on a contact surface 8e in contact with the third anchoring layer 9, in addition to the fitting portion 8b. As depicted in an enlarged view in FIG. 5, the convex 8c projects from the contact surface 8e toward the first conductor layer 1. The contact surface 8e is a surface at which the frame member 8-2 comes into contact with the third anchoring layer 9 fixing the frame member 8-2 on the first conductor layer 1.

Provision of the projection 7b at the external connecting member 7 as well as the fitting portion 8b and the convex 8c at the frame member 8-2, as described above, can achieve precise determination of the minimum thickness and the maximum thickness of the second anchoring layer 6 without using any jig tool. Thus, this can achieve improvement, from a conventional configuration, in reliability of the joint between the electrode of each of the semiconductor elements 5 and the external connecting member 7.

More specifically, the convex 8c thus provided enables precise determination of the thickness of the third anchoring layer 9 and appropriate disposition of the frame member 8-2 relative to the first conductor layer 1. This can minimize positional displacement between the fitting portion 8b provided at the frame member 8-2 and the external connecting member 7. The convex 8c thus contributes to stable positioning of the external connecting member 7 and also enables precise determination of the thickness of the second anchoring layer 6.

Provision of at least three convexes 8c on the contact surface 8e can achieve minimum necessary thickness determination. Alternatively, to achieve more reliable thickness determination, the convexes 8c may be continuously provided on the contact surface 8e of the frame member 8-2 or be discontinuously provided, i.e., skipping from one to another on the contact surface 8e.

Embodiment 4

Figure 6:
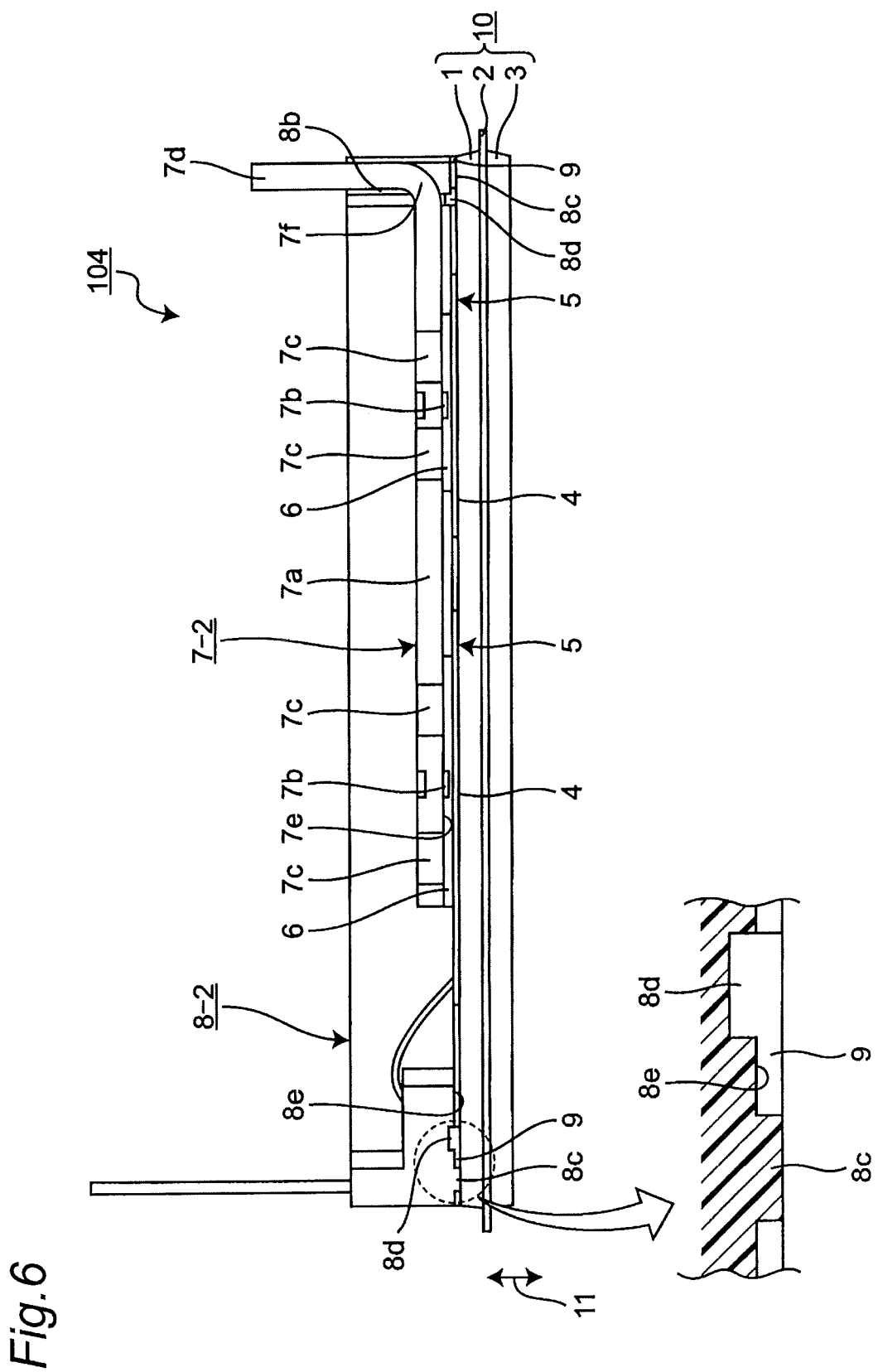
FIG. 6 is a sectional view of a power semiconductor device according to an embodiment 4.

A power semiconductor device 104 according to the present embodiment 4 will now be described with reference to FIG. 6. The power semiconductor device 104 also includes the frame member 8-2 described in the embodiment 3. FIG. 6 depicts the power semiconductor device 104 obtained by replacing the frame member 8 with the frame member 8-2 in the power semiconductor device 102 according to the embodiment 2 including the external connecting member 7-2. It is alternatively possible to adopt a configuration obtained by replacing the frame member 8 with the frame member 8-2 in the power semiconductor device 101 according to the embodiment 1.

Also in the power semiconductor device 104 according to the present embodiment 4, the frame member 8-2 includes the convex 8c projecting from the contact surface 8e toward the first conductor layer 1. The convex 8c makes the distance between the frame member 8-2 and the first conductor layer 1 precisely determine and the thickness of the third anchoring layer 9 precisely determine. As a result, the power semiconductor device 104 also has the configuration for minimizing positional displacement between the external connecting member 7-2 and the fitting portion 8b of the frame member 8-2. The third anchoring layer 9 is preferably made of a silicone-based adhesive agent in terms of workability.

However, in a case where the third anchoring layer 9 flows down along a side surface from an upper surface of the first conductor layer 1 and reaches an interface with the insulating layer 2, the third anchoring layer 9 may enclose voids such as air, and it may make electric field distribution deteriorate. It is considered that this possibly may lead to shortage of creeping discharge distance of the insulating layer 2, in other words, creeping discharge distance from the first conductor layer 1 to the second conductor layer 3.

In order to suppress such possibility, the frame member 8-2 in the power semiconductor device 104 according to the present embodiment 4 has a recess 8d provided in the contact surface 8e in contact with the third anchoring layer 9. The recess 8d thus provided serves as a refuge space for the third anchoring layer 9. When the third anchoring layer 9 exceeding an appropriate amount is supplied, the recess 8d receives excess. Thus, the recess 8d can absorb or adjust a variation in an amount of the third anchoring layer 9.

As a result, even in such a case where the third anchoring layer 9 is excessively provided, this configuration can prevent the third anchoring layer 9 from flowing down from the upper surface of the first conductor layer 1 to the interface with the insulating layer 2, can prevent void formation, and can prevent shortage of the creeping discharge distance.

Further, even when the frame member 8 has a distorted shape with a warp or the like and even when the first conductor layer 1 also has a distorted shape with a warp or the like, the configuration in the Embodiment 4 enables adjustment in amount of the third anchoring layer 9. Thus, the power semiconductor device 104 can significantly be improved in productivity.

Embodiment 5

In a power semiconductor device according to the present embodiment 5, modification is made to the external connecting member 7 or the external connecting member 7-2 according to any one of the embodiments 1 to 4. The following description will thus refer mainly to the external connecting member 7 or the external connecting member 7-2.

For example, driving motors for the automobiles become diversifying and varying, such as motors for a hybrid vehicle including one or two motors and an engine, for an electric vehicle including only a motor, and the like. Accordingly, inverters used to drive these motors are required to have various reliability specifications according to the respective systems. Further, these inverters according to the various reliability specifications are required to achieve cost reduction and high quality as well as size reduction.

Particularly in a case where the joint relevant to the second anchoring layer 6 is required to have higher reliability, it is effective measures that each of the external connecting member 7 and the external connecting member 7-2 is made of Cu, and further each of the external connecting member 7 and the external connecting member 7-2 has a linear expansion coefficient approximate to that of the semiconductor element (e.g. 2.5 ppm/K for silicon). For example, in a case where each of the external connecting member 7 and the external connecting member 7-2 is made of a clad material having three stacked layers of Cu, invar (i.e. Fe-36% Ni alloy), and Cu, an apparent linear expansion coefficient of an electrode surface can be controlled by adjusting thickness ratios of these layers. For example, the linear expansion coefficient is 4 ppm/K with the invar having a large ratio (Cu:Invar:Cu=1:8:1), and is 13 ppm/K with the invar having a small ratio (Cu:Invar:Cu=2:1:2). The linear expansion coefficients of the external connecting member 7 and the external connecting member 7-2 can appropriately be varied between the linear expansion coefficient of silicon (2.5 ppm/K) and the linear expansion coefficient of Cu (17 ppm/K). For example, the linear expansion coefficients of the external connecting member 7 and the external connecting member 7-2 can be set to be less than the linear expansion coefficient of an Cu alloy and more than the linear expansion coefficient of the semiconductor element.

Accordingly, the second anchoring layer 6 has a distortion amount significantly reduced by decreasing the difference in the linear expansion coefficient of each of the external connecting member 7 and the external connecting member 7-2 from that of the power semiconductor elements 5. This can achieve improvement in joint reliability of the external connecting member 7 and the external connecting member 7-2. The applicant has confirmed that the external connecting member 7 and the external connecting member 7-2 made of Cu:Invar:Cu=1:1:1 can effectively achieve life prolongation of ten or more times of the life of an electrode made of Cu alloy. A Cu—Mo alloy, a Cu—W alloy, and the like are found to achieve improvement in connection reliability without causing extreme deterioration in thermal conductivity.

As described above, the external connecting member 7 and the external connecting member 7-2 can achieve significant improvement in connection reliability only by changing the material and the shape. Thus, the external connecting member 7 and the external connecting member 7-2 are applicable to various inverters for different usage environments and operation modes only by changing the material and shape thereof. This enables commonalization of steps of producing power semiconductor devices and can achieve reduction in production cost. The inverters can thus achieve size reduction, high vibration resistance, and cost reduction.

The embodiments described above can be combined together, or the configurations included in the different embodiments can be combined together.

The present invention has been described sufficiently in connection with the preferred embodiments with reference to the accompanying drawings. Various modifications and corrections are apparent to those skilled in the art. Such modifications and corrections should be regarded as being included in the scope of the invention unless departing from the scope recited in the following claims.

The entire disclosure in the description, drawings, claims, and abstract of Japanese patent application No. 2015-211583 filed on Oct. 28, 2015 is incorporated herein as a reference.

DESCRIPTION OF REFERENCE SYMBOLS

1 FIRST CONDUCTOR LAYER
2 INSULATING LAYER
3 SECOND CONDUCTOR LAYER
4 FIRST ANCHORING LAYER
5 SEMICONDUCTOR ELEMENT
6 SECOND ANCHORING LAYER
7 EXTERNAL CONNECTING MEMBER
7a ELEMENT COUPLER
7b PROJECTION
7c RECESS
7d EXTERNAL CONNECTION END
7e CONTACT SURFACE
7-2 EXTERNAL CONNECTING MEMBER
8 FRAME MEMBER
8b FITTING PORTION
8c CONVEX
8d RECESS
8e CONTACT SURFACE
8-2 FRAME MEMBER
9 THIRD ANCHORING LAYER
10 INSULATING SUBSTRATE
101 to 104 POWER SEMICONDUCTOR DEVICE

The invention claimed is:

1. A power semiconductor device comprising:
an insulating substrate configured to include a first conductor layer and a second conductor layer provided respectively on opposite surfaces in a thickness direction of an insulating layer;
a plurality of semiconductor elements joined to the first conductor layer via a first anchoring layer;
an external connecting member having an element coupler and an external connection end, wherein the external connecting member is bent between the external connection end and the element coupler in the thickness direction, the element coupler extending along the first conductor layer with the semiconductor elements positioned between the external connecting member and the first conductor layer, and joined to the semiconductor elements via a second anchoring layer; and
a frame member surrounding the plurality of semiconductor elements on the first conductor layer and joined to the first conductor layer via a third anchoring layer; wherein
the frame member includes a fitting portion fitted to the external connection end,
the external connecting member includes at least two projections extending toward the semiconductor elements, and
the first conductor layer is positioned above the insulating layer, and the frame member is positioned entirely above the first conductor layer.

2. The power semiconductor device according to claim 1, wherein the element coupler includes a recess provided in a contact surface contacting with the second anchoring layer.

3. The power semiconductor device according to claim 1, wherein the frame member further includes a convex extending toward the first conductor layer, the convex being provided on a contact surface contacting with the third anchoring layer.

4. The power semiconductor device according to claim 1, wherein the frame member further includes a recess provided in the contact surface contacting with the third anchoring layer.

5. The power semiconductor device according to claim 1, wherein the external connecting member has a linear expansion coefficient less than a linear expansion coefficient of a Cu alloy and more than a linear expansion coefficient of the semiconductor elements.

* * * * *